US012534821B2

(12) United States Patent
Ma'aya et al.

(10) Patent No.: US 12,534,821 B2
(45) Date of Patent: Jan. 27, 2026

(54) PROCESSING SYSTEMS, CHAMBERS, AND RELATED METHODS INCLUDING TURBINES FOR ENERGY HARNESSING

(71) Applicant: Applied Materials, Inc., Santa Clara, CA (US)

(72) Inventors: Awse Ma'aya, Los Altos, CA (US); Ala Moradian, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 393 days.

(21) Appl. No.: 18/122,537

(22) Filed: Mar. 16, 2023

(65) Prior Publication Data

US 2024/0309548 A1 Sep. 19, 2024

(51) Int. Cl.

| | |
|---|---|
| ***C30B 25/14*** | (2006.01) |
| ***C30B 25/08*** | (2006.01) |
| ***C30B 25/10*** | (2006.01) |
| ***C30B 25/12*** | (2006.01) |
| ***F03G 7/00*** | (2006.01) |
| ***H01J 13/32*** | (2006.01) |
| ***H01J 17/28*** | (2006.01) |
| ***H01J 19/74*** | (2006.01) |

(52) U.S. Cl.

CPC ............ *C30B 25/08* (2013.01); *C30B 25/105* (2013.01); *C30B 25/12* (2013.01); *C30B 25/14* (2013.01); *F03G 7/0252* (2021.08); *H01J 13/32* (2013.01); *H01J 17/28* (2013.01); *H01J 19/74* (2013.01)

(58) Field of Classification Search

None

See application file for complete search history.

(56) References Cited

U.S. PATENT DOCUMENTS 6,095,083 A * 8/2000 Rice .................. H01J 37/32165 118/724
9,787,156 B1 10/2017 Cannon
10,431,726 B2 10/2019 Ozturk et al.

(Continued)

FOREIGN PATENT DOCUMENTS

JP 2014056894 A 3/2014

OTHER PUBLICATIONS

International Search Report and Written Opinion dated Jun. 3, 2024 for Application No. PCT/US2024/012082.

(Continued)

*Primary Examiner* — Jason Berman

(74) *Attorney, Agent, or Firm* — Patterson + Sheridan, LLP

(57) ABSTRACT

A processing system including a chamber that includes one or more sidewalls defining an internal volume, one or more heat sources configured to generate heat, a liner disposed in the internal volume and lining one or more sidewalls, and one or more cooling channels. The processing system includes a fluid system in fluid communication with the cooling channels, the fluid system including one or more supply lines configured to supply a fluid to the cooling channels at a first temperature, and one or more return lines configured to flow the fluid from the cooling channels at a second temperature that is higher than the first temperature, and a fluid motor configured to move the fluid. The processing system includes an energy harnessing device configured to harness energy to produce electrical energy, the energy harnessing device including one or more turbines.

18 Claims, 9 Drawing Sheets

(56) References Cited

U.S. PATENT DOCUMENTS

| | | | |
|---|---|---|---|
| 11,049,719 | B2 | 6/2021 | Hawrylchak et al. |
| 2010/0087052 | A1 | 4/2010 | Xu |
| 2017/0098977 | A1 * | 4/2017 | Caristan .................. F02C 1/002 |
| 2017/0130359 | A1 | 5/2017 | Ranish et al. |
| 2017/0198583 | A1 * | 7/2017 | Dean ..................... F01D 17/145 |
| 2017/0260634 | A1 * | 9/2017 | Sullivan .................. C25B 11/02 |
| 2022/0349043 | A1 * | 11/2022 | Paraillloux ......... H01L 21/67259 |

OTHER PUBLICATIONS

Terry Hendricks et al., "Engineering Scoping Study of Thermoelectric Generator Systems for Industrial Waste Heat Recovery", U.S. Department of Energy Industrial Technologies Program, Nov. 2006.

Formula 1 Technical, 2015, Honda Racing F1 Power Unit, In-Detail, https://formula1technical.weebly.com/articles/2015-honda-racing-f1-power-unit-in-detail.

Kinetic energy recovery system, https://energyeducation.ca/encyclopedia/Kinetic_energy_recovery_system.

* cited by examiner

PROCESSING SYSTEMS, CHAMBERS, AND RELATED METHODS INCLUDING TURBINES FOR ENERGY HARNESSING

BACKGROUND

Field

Embodiments of the present disclosure relate to chambers, methods, systems, and related components for recovering energy in relation to substrate processing for semiconductor manufacturing.

Description of the Related Art

Semiconductor substrates are processed for a wide variety of applications, including the fabrication of integrated devices and microdevices. Substrates can undergo a variety of processing operations, which can involve high temperature operations. As an example, substrates and other chamber components can experience temperatures that may lead to a loss in material integrity of certain chamber components. Efforts to address complications from heat can lead to inefficient energy utilization, such as waste in energy that is lost in the form of heat.

Therefore, a need exists for chambers, systems, and methods that facilitate more efficient energy utilization.

SUMMARY

Embodiments of the present disclosure relate to chambers, methods, systems, and related components for recovering energy in relation to substrate processing for semiconductor manufacturing. In one or more embodiments, energy produced for processing operations is harnessed and converted into electrical energy which, in turn, can be transmitted to an electrical grid and/or is stored and utilized for further processing operations.

In one or more embodiments, a processing system applicable for use in semiconductor manufacturing includes a chamber which includes one or more sidewalls at least partially defining an internal volume, one or more windows at least partially defining a processing volume of the internal volume, one or more heat sources configured to generate heat, a liner disposed in the internal volume and lining at least part of one or more sidewalls, and one or more cooling channels. The processing system further includes a fluid system in fluid communication with the one or more cooling channels, and the fluid system includes one or more supply lines configured to supply a fluid to the one or more cooling channels at a first temperature, and one or more return lines configured to flow the fluid from the one or more cooling channels at a second temperature that is higher than the first temperature, and a fluid motor configured to move the fluid. The processing system further includes an energy harnessing device configured to harness energy to produce electrical energy, the energy harnessing device including one or more turbines.

In one or more embodiments, a processing system applicable for use in semiconductor manufacturing includes a chamber including one or more sidewalls at least partially defining an internal volume, one or more windows at least partially defining a processing volume of the internal volume, one or more heat sources configured to generate heat, a liner disposed in the internal volume and lining at least part of one or more sidewalls, a substrate support disposed in the internal volume, and a support shaft coupled to the substrate support. The processing system further includes a drive system, the drive system including a rotation motor configured to rotate the support shaft, a lift motor configured to raise and lower the support shaft, and a drive battery configured to supply electrical power to the rotation motor and the lift motor. The processing system further includes an energy harnessing device configured to harness energy from the support shaft to produce electrical energy.

In one or more embodiments, a method of substrate processing for semiconductor processing includes heating a substrate positioned in a processing volume of a chamber, flowing one or more process gases over the substrate to form one or more layers on the substrate, flowing a fluid through at least part of the chamber to cool at least the part of the chamber, and harnessing energy. The harnessing includes rotating a rotor relative to a stator, and directing the harnessed energy toward a recycling system.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to chambers, methods, systems, and related components for recovering energy in relation to substrate processing for semiconductor manufacturing. In one or more embodiments, energy produced for processing operations is harnessed and converted into electrical energy which, in turn, can be transmitted to an electrical grid and/or is stored and utilized for further processing operations.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
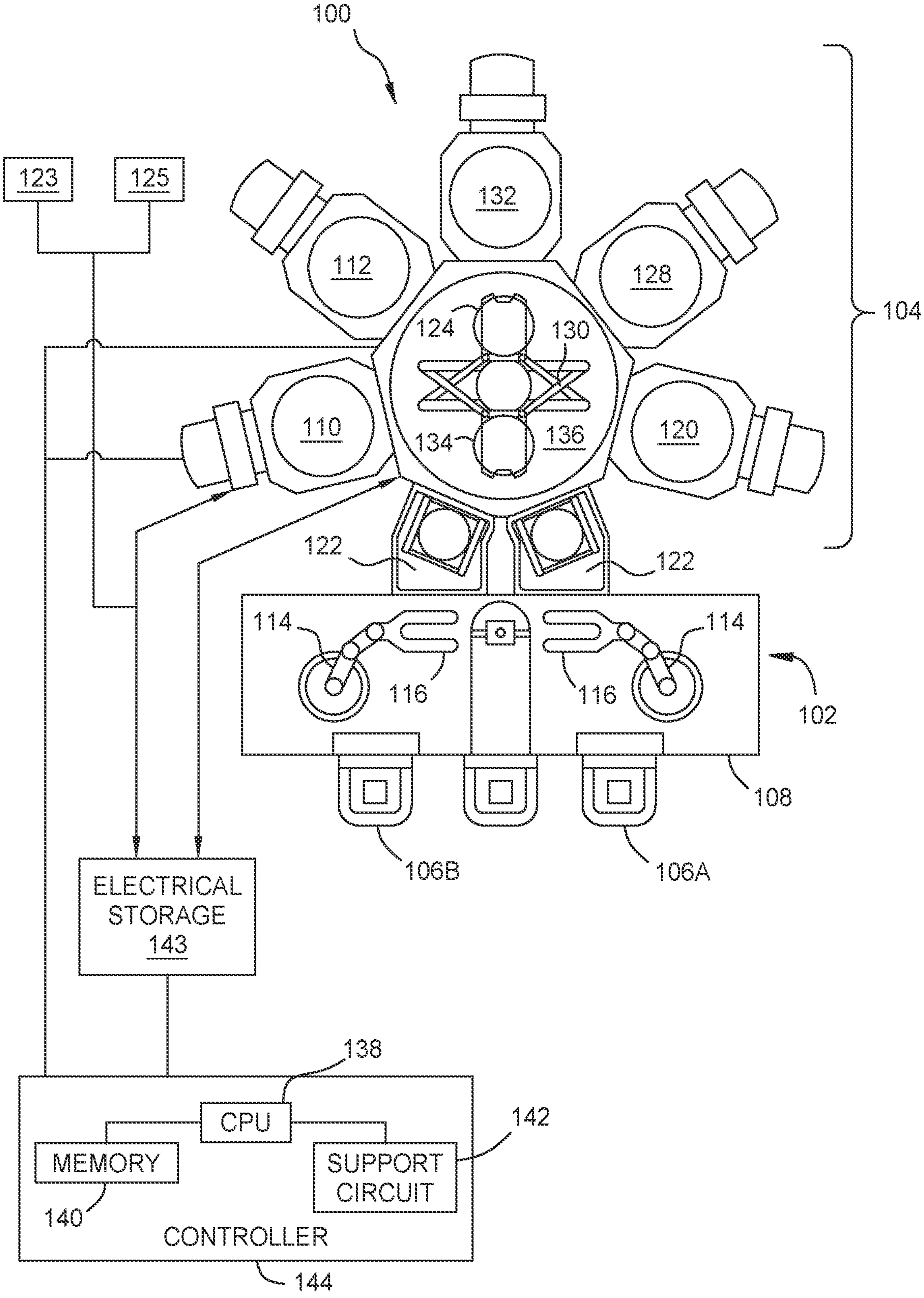
FIG. 1 is a schematic diagram top plan view of a processing system, according to one or more embodiments.

FIG. 1 is a schematic diagram top plan view of a processing system 100, according to one or more embodiments. The processing system 100 includes one or more substrate load lock chambers 122, a vacuum-tight processing platform 104, a factory interface 102, and a controller 144. The processing system 100 includes subfab support equipment 123 (e.g., a pump, abatement equipment, a scrubber, a heat exchanger, and/or a chiller), electrical storage device 143 (e.g. battery), and reactor support modules 125 (e.g., a gas panel, an AC box, controller(s), and/or a facility tray). The controller 144 can be part of the reactor support modules 125. The substrate load lock chambers 122 may be load lock chambers. In one or more embodiments, the processing system 100 may be a CENTURA® integrated processing system, commercially available from Applied Materials, Inc., located in Santa Clara, California. It is contemplated that other processing systems (including those from other manufacturers) may be adapted to benefit from the disclosure.

The platform 104 includes a plurality of processing chambers 110, 112, 128, 120, 132 and the one or more substrate load lock chambers 122 that are coupled to a vacuum substrate transfer chamber 136. In one or more embodiments, the processing chambers 110, 112, 128, 120, 132 include heat sources and heat sinks. Two substrate load lock chambers 122 are shown in FIG. 1. The factory interface 102 is coupled to the transfer chamber 136 through the substrate load lock chambers 122.

An electrical storage device 143 is electrically connected to one or more of the controller 144, the processing system 100 (such as parts, for example the transfer chamber 136, of the processing platform 104), the subfab support equipment 123, the reactor support modules 125, and/or one or more of the processing chambers 110, 112, 128, 120, 132 for power supply. In one or more embodiments, the electrical storage device 143, subfab support equipment 123, and/or reactor support modules 125 are mounted to the processing platform 104. It is also contemplated that electrical storage device 143, subfab support equipment 123, and/or reactor support modules 125 may be offset from the processing platform 104 (e.g. off-board of the processing platform 104). In one or more embodiments, the electrical storage device 143 includes one or more batteries. In one or more embodiments, the electrical storage device 143 includes an input to an electrical grid.

In one or more embodiments, the factory interface 102 includes at least one docking station 108 and at least one factory interface robot 114 to facilitate the transfer of substrates. The docking station 108 is configured to accept one or more front opening unified pods (FOUPs). Two FOUPS 106A, 106B are shown in the implementation of FIG. 1. The factory interface robot 114 having a blade 116 disposed on one end of the robot 114 is configured to transfer one or more substrates from the FOUPS 106A, 106B, through the substrate load lock chambers 122, and to the processing platform 104 for processing. Substrates being transferred can be stored at least temporarily in the substrate load lock chambers 122.

Each of the substrate load lock chambers 122 has a first port interfacing with the factory interface 102 and a second port interfacing with the transfer chamber 136. The substrate load lock chambers 122 are coupled to a pressure control system which pumps down and vents the substrate load lock chambers 122 to facilitate passing the substrates between the vacuum environment of the transfer chamber 136 and a substantially ambient (e.g., atmospheric) environment of the factory interface 102.

The transfer chamber 136 has a vacuum robot 130 disposed therein. The vacuum robot 130 has a blade 134 capable of transferring the substrates 124 between the substrate load lock chambers 122 and the processing chambers 110, 112, 132, 128, 120.

The controller 144 is communicatively coupled to the processing system 100. The controller 144 controls the operations of the system 100 using a direct control of the process chambers 110, 112, 132, 128, 120 of the system 100 or alternatively, by controlling the computers (or controllers) associated with the process chambers 110, 112, 128, 120, 132 and the system 100. In operation, the controller 144 enables data collection and feedback from the respective chambers and controller 144 to optimize performance of the system 100.

The controller 144 is used to control processes and methods, such as the operations of the methods described herein (for example the operations of the method 600 and/or the method 700 described below). The controller 144 includes a central processing unit (CPU) 138, a memory 140 containing instructions, and support circuits 142 for the CPU. The controller 144 controls various items directly, or via other computers and/or controllers. In one or more embodiments, the controller 144 is communicatively coupled to dedicated controllers, and the controller 144 functions as a central controller.

The controller 144 is of any form of a general-purpose computer processor that is used in an industrial setting for controlling various substrate processing chambers and equipment, and sub-processors thereon or therein. The memory 140, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 142 of the controller 144 are coupled to the CPU 138 for supporting the CPU 138 (a processor). The support circuits 142 can include cache, power supplies, clock circuits, input/output circuitry and subsystems, and the like. Operational parameters (such as process gas concentration, process gas flow rate, heating power for processing temperature, substrate support rotation speed, cooling fluid flow rate, cooling fluid temperature, and/or other process recipe parameter(s)) and operations are stored in the memory 140 as software routine(s) that are executed or invoked to turn the controller 144 into a specific purpose controller to control the operations of the various systems/chambers/units/modules described herein. The software routine(s), when executed by the CPU 138, transform the CPU 138 into a specific purpose computer. The software routines may also be stored and/or executed by a second controller (not shown) that is located remotely from the system 100.

The controller 144 is configured to conduct any of the operations described herein. The instructions stored on the memory, when executed, cause one or more of operations of method 600 and/or method 700 (described below) to be conducted.

The various operations described herein can be conducted automatically using the controller 144, or can be conducted automatically and/or manually with certain operations conducted by a user.

The controller 144 is configured to adjust output to controls of the system 100 based off of sensor readings, a system model, and stored readings and calculations. As an example, one or more operating parameters can be measured by one or more sensors positioned along the system 100. The controller 144 includes embedded software and a compensation algorithm to calibrate measurements. The controller 144 can include one or more machine learning algorithms and/or artificial intelligence algorithms that estimate optimized parameters for deposition operation(s), cleaning operations, etching operations, and/or atomic radical treatment operation(s). The one or more machine learning algorithms and/or artificial intelligence algorithms can use, for example, a regression model (such as a linear regression model) or a clustering technique to estimate optimized parameters. The algorithm can be unsupervised or supervised.

The one or more machine learning algorithms and/or artificial intelligence algorithms can optimize the operating parameters used in relation to operations described herein. In one or more embodiments, the one or more machine learning algorithms and/or artificial intelligence algorithms learn power usage throughout processing operations and optimize parameters to reduce energy usage while maintaining or enhanced processing efficacy. In one or more embodiments, the one or more machine learning algorithms and/or artificial intelligence algorithms optimize processing power and/or process recipe parameter(s).

Figure 2:
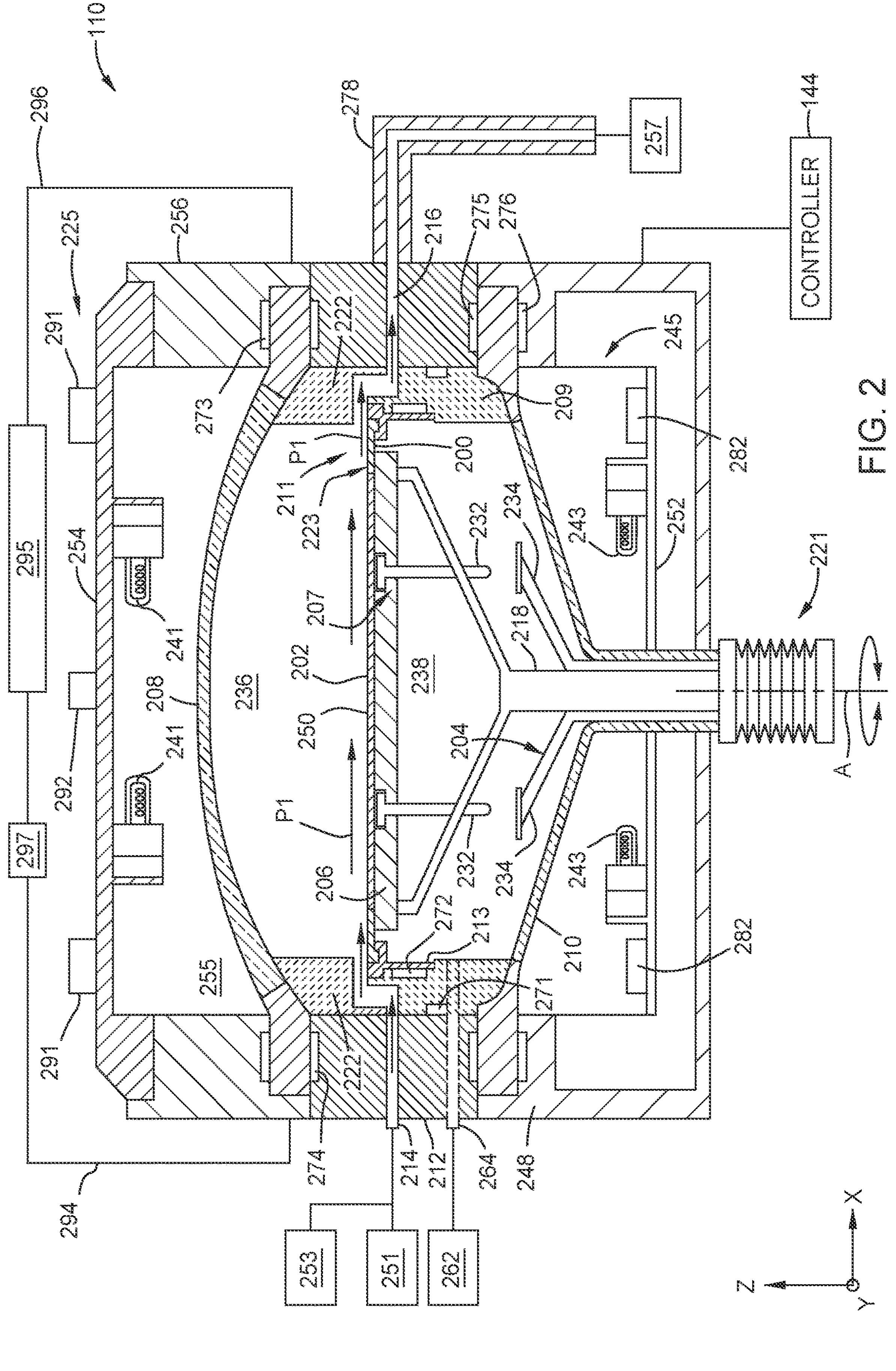
FIG. 2 is a partial schematic side cross-sectional view of a processing system including a processing chamber, according to one or more embodiments.

FIG. 2 is a partial schematic side cross-sectional view of a processing system including a processing chamber, such as processing chamber 110 shown in FIG. 1, according to one or more embodiments. The processing chamber 110 is a deposition chamber. In one or more embodiments, the processing chamber 110 is an epitaxial deposition chamber. The processing chamber 110 is utilized to grow an epitaxial film on a substrate 202. The processing chamber 110 creates a cross-flow of precursors across a top surface 250 of the substrate 202. In one or more embodiments, the process chamber 110 includes a reactor portion 225.

The processing chamber 110 includes an upper body 256, a lower body 248 disposed below the upper body 256, and a flow module 212 disposed between the upper body 256 and the lower body 248. The upper body 256, the flow module 212, and the lower body 248 form at least part of a chamber body. Disposed within the chamber body is a substrate support 206, an upper window 208 (such as an upper dome), a lower window 210 (such as a lower dome), a plurality of upper heat sources 241, and a plurality of lower heat sources 243. As shown, a controller 144 is in communication with the processing chamber 110 and is used to control processes and methods, such as the operations of the methods described herein. In one or more embodiments, an electrical storage device 143 is in communication with the processing chamber 110 and is configured to store recycled energy from the processing chamber 110. The electrical storage device 143 is in communication with the controller 144. In one or more embodiments, the electrical storage device 143 is a battery, such as an onboard battery mounted to the platform 104 or an offboard central battery that supplies power to a plurality of cluster tools. The battery can be mounted to the same frame of the platform 104 as the transfer chamber 136 and the one or more processing chambers 110, 112, 120, 128, 132.

In the implementation shown in FIG. 2, the heat sources 241, 243 are lamps. Other heat sources are contemplated, such as resistive heaters, light emitting diodes (LEDs), and/or lasers.

The processing chamber 110 may include one or more sensors 291, 292, 282, such as temperature sensors (e.g., optical pyrometers) or other metrology sensors, which measure temperatures (or other parameters) within the processing chamber 110 (such as on the surfaces of the upper window 208, surfaces of the lower window 210, and/or one or more surfaces of the substrate 202 and/or the substrate support 206). The one or more sensors 291, 292 are disposed on the lid 254. The one or more sensors 282 (e.g., lower pyrometers) are disposed on or adjacent to a floor 252. The one or more sensors 282 can be disposed on the lower side of the lower window 210.

The substrate support 206 is disposed between the upper window 208 and the lower window 210. The substrate support 206 includes a support face 223 that supports the substrate 202. The plurality of upper heat sources 241 are disposed between the upper window and a lid 254. The plurality of upper heat sources 241 form a portion of the upper heat source module 255. The plurality of lower heat sources 243 are disposed between the lower window 210 and the floor 252. The plurality of lower heat sources 243 form a portion of a lower heat source module 245. The upper window 208 and the lower window 210 are formed of an energy transmissive material, such as quartz, e.g. transparent quartz.

A process volume 236 and a purge volume 238 are formed between the upper window 208 and the lower window 210. The process volume 236 and the purge volume 238 are part of an internal volume defined at least partially by the upper window 208, the lower window 210, an upper liner 222, and one or more lower liners 209. In one or more embodiments, the one or more lower liners 209 include an inner liner 213.

The internal volume has the substrate support 206 disposed therein. The substrate support 206 includes a top surface on which the substrate 202 is disposed. The substrate support 206 is attached to a shaft 218. The shaft 218 is connected to a motion assembly 221. The motion assembly 221 includes one or more actuators and/or adjustment devices that provide movement and/or adjustment for the shaft 218 and/or the substrate support 206 within the processing volume 236.

The substrate support 206 may include lift pin holes 207 disposed therein. The lift pin holes 207 are sized to accommodate lift pins 232 for lowering and lifting of the substrate 202 to and from the substrate support 206 before and after a deposition process is conducted. The lift pins 232 may rest on lift pin stops 234 when the substrate support 206 is lowered from a process position to a transfer position. The lift pin stops 234 can be coupled to a second shaft 204 through a plurality of arms.

The flow module 212 includes a plurality of gas inlets 214, a plurality of purge gas inlets 264, and one or more gas exhaust outlets 216. In one or more embodiments, the plurality of gas inlets 214 and the plurality of purge gas inlets 264 are disposed on the opposite side of the flow module 212 from the one or more gas exhaust outlets 216. The upper liner 222 and the one or more lower liners 209 are disposed on inner surface(s) of the flow module 212 and protect the flow module 212 from reactive gases used during deposition operations and/or cleaning operations. The gas inlet(s) 214 and the purge gas inlet(s) 264 are each positioned to flow a gas parallel to the top surface 250 of the substrate 202 disposed within the process volume 236. The gas inlet(s) 214 are fluidly connected to one or more process gas sources 251 and one or more cleaning gas sources 253. The purge gas inlet(s) 264 are fluidly connected to one or more purge gas sources 262. The one or more gas exhaust outlets 216 are fluidly connected to an exhaust pump 257. One or more process gases supplied using the one or more process gas sources 251 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 262 can include one or more inert gases (such as one or more of argon (Ar), helium (He), hydrogen ($H_2$), and/or nitrogen ($N_2$)). One or more cleaning gases supplied using the one or more cleaning gas sources 253 can include one or more of hydrogen (H) and/or chlorine (Cl). In one or more embodiments, the one or more process gases include silicon phosphide (SiP) and/or phospine ($PH_3$), and the one or more cleaning gases include hydrochloric acid (HCl).

The one or more gas exhaust outlets 216 are further connected to or include an exhaust system 278. The exhaust system 278 fluidly connects the one or more gas exhaust outlets 216 and the exhaust pump 257. The exhaust system 278 can assist in the controlled deposition of a layer on the substrate 202. In one or more embodiments, the exhaust system 278 is disposed on an opposite side of the processing chamber 110 relative to the gas inlet(s) 214 and/or the purge gas inlets 264.

A pre-heat ring 200 is disposed outwardly of the substrate support 206. In one or more embodiments, the pre-heat ring 200 is supported on a ledge of the inner liner 213. In one or more embodiments, the pre-heat ring 200 is formed of one or more of quartz (such as a transparent quartz—e.g. clear quartz, and/or opaque quartz—e.g. white quartz, grey quartz, and/or black quartz), silicon carbide (SiC), and/or graphite coated with SiC. The processing chamber 110 includes one or more cooling channels 271, 272, 273, 274, 275, 276. The one or more cooling channels 271, 272 can be disposed between the lower liner 209 and the inner liner 213 and/or outwardly of the lower liner 209. The one or more cooling channels 271, 272, 273, 274, 275, 276 can be filled with a fluid, such as water, air, and/or other liquids or gas(es). The one or more cooling channels 271, 272, 273, 274, 275, 276 can function as thermal barriers and/or can be controlled to adjust temperatures in the one or more cooling channels 271, 272, 273, 274, 275, 276. The one or more cooling channels 271, 272, 273, 274, 275, 276 can be used to cool one or more sidewalls of the chamber body, the liners 209, 213, 222, and/or the windows 208, 210. In one or more embodiments, as shown in FIG. 2, cooling channels 273, 274, 275, 276 interface with and/or are aligned above and below outer sections of the upper window 208 and the lower window 210, respectively. In one or more embodiments, as shown in FIG. 2, cooling channels 271, 272 are disposed between liners 209, 213, 222 and/or are disposed between liners 209, 213, 222 and the one or more sidewalls of the chamber body.

In one or more embodiments, the liners 209, 213, and/or 222 are formed of one or more of quartz (such as transparent quartz—e.g. clear quartz, and/or opaque quartz—e.g. white quartz, grey quartz, and/or black quartz), silicon carbide (SiC), and/or graphite coated with SiC.

In the implementation shown in FIG. 2, the inner liner 213 and the pre-heat ring 200 are separate bodies. In one or more embodiments, the pre-heat ring 200 and the inner liner 213 are integrally formed as a monolithic body. In the implementation shown in FIG. 2, the inner liner 213 and the lower liner 209 are separate bodies. In one or more embodiments, the lower liner 209 and the inner liner 213 are integrally formed as a monolithic body.

One or more process gases P1 flow from the gas inlet(s) 214, into the processing volume 236, and over the substrate 202 to form (e.g., epitaxially grow) one or more layers on the substrate 202 while the heat sources 241, 243 heat the pre-heat ring 200, the substrate support 206, and/or the substrate 202. After flowing over the substrate 202, the one or more process gases P1 flow out of the internal volume through the one or more gas exhaust outlets 216. The flow module 212 can be at least part of a sidewall of the processing chamber 110. The present disclosure also contemplates that one or more purge gases can be supplied to the purge volume 238 (e.g., through the plurality of purge gas inlets 264) during the deposition operation, and exhausted from the purge volume 238.

A heat exchanger unit 295 is fluidly connected to the process chamber 110 through one or more supply lines 294 and one or more return lines 296. It is contemplated that the supply lines 294 and the return lines 296 can include an upper supply line, a lower supply line, an upper return line, and a lower return line. A fluid motor 297 (e.g., a variable speed blower (VSB), a fan, a gas compressor, and/or a liquid pump) is configured to blow cold fluid (e.g., air and/or water) into portions (e.g., one or more of the cooling channels 271, 272, 273, 274, 275, 276) of the process chamber 110 via the one or more supply lines 294. Upon entering the process chamber 110, the cold fluid is heated and is exhausted from the processing chamber 110 via the one or more return lines 296. The present disclosure contemplates that the fluid motor 297 can be downstream from the heat exchanger unit 295 (as shown in FIG. 2), upstream of the heat exchanger unit 295, and/or integrated with the heat exchanger unit 295.

Vibration dampener(s) (such as accelerometer(s) and/or fluid(s)) can be used to harness energy in the form of mechanical vibration from the fluid motor 297 (and/or other similar system components or portions that involve mechanical vibration). The vibration can be caused, for example, by moving components (such as rotary components). The harnessed energy would otherwise be lost in the form of mechanical vibration. The harnessed energy can be redirected and/or recycled. For example, generator(s) connected to the vibration dampener(s) (e.g., accelerometer(s)) may efficiently convert vibrations into electrical energy (e.g., current and/or voltage), and/or the vibrations may be dampened. The electrical energy may be harnessed and recycled. The electrical energy converted from vibrations can be harnessed, for example, in addition to electrical energy harnessed from thermal energy. In one or more embodiments, fluid (such as viscous fluid(s) and/or other fluid(s)) is used to dampen vibration of a component, and the vibration transfer heat to the fluid. For example, at least part of the vibrating component is immersed in the fluid. The heat transferred to the fluid can be harnessed from the fluid and converted to electrical energy.

Figure 3A:
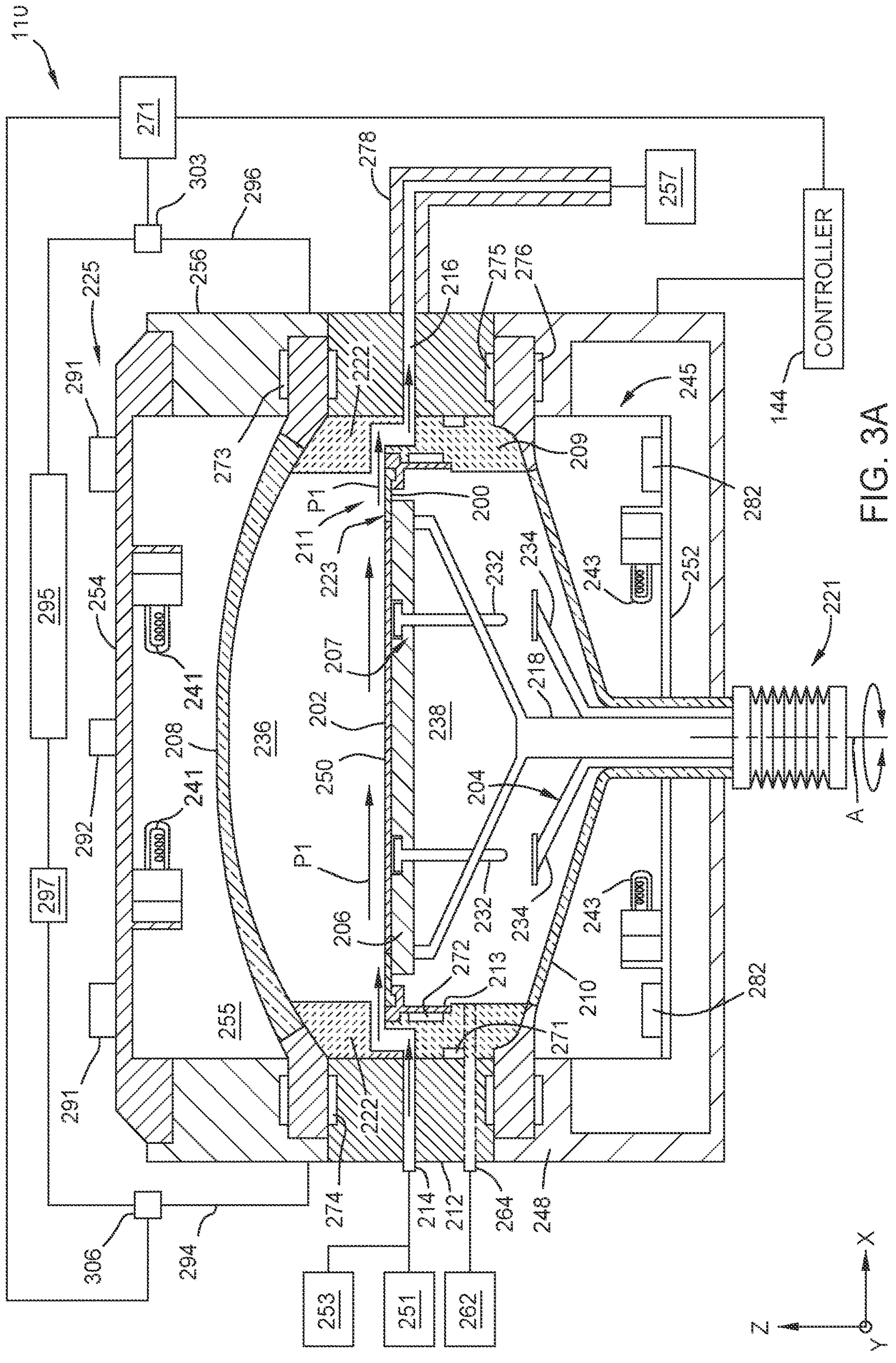
FIG. 3A is a partial schematic side cross-sectional view of a processing system including a processing chamber including one or more fluid turbines, according to one or more embodiments.

FIG. 3A is a partial schematic side cross-sectional view of a processing system including a processing chamber, such as the processing chamber 110 of FIG. 2, including one or more fluid turbines 303, 306, according to one or more embodiments. The one or more fluid turbines 303, 306 are respectively at least part of an energy harnessing device.

The processing system shown in FIG. 3A is similar to the processing system shown in FIG. 2, and includes one or more features, aspects, components, operations, and/or properties thereof. In one or more embodiments, as shown in FIG. 3A, the one or more fluid turbines 303, 306 are positioned along (e.g., within) the one or more supply lines 294, the one or more return lines 296, and/or the one or more cooling channels 271, 272, 273, 274, 275, 276. In one or more embodiments, one or more fluid turbines 303, 306 are positioned within the gas exhaust outlets 216. Other positions of the one or more fluid turbines 303, 306 are contemplated throughout the processing system. In one or more embodiments, the one or more fluid turbines 303, 306 include one or more motor generator units (MGUs). The one or more fluid turbines 303, 306 can include, for example, a gas turbine, a wind turbine, a liquid turbine (such as a hydro-generator), or some combination thereof. Other turbines are contemplated. In one or more embodiments, a first fluid turbine 303 positioned along a return line 296 is a wind turbine (such as a hot wind turbine), a gas turbine (such as a hot gas turbine), or a liquid turbine (such as a hydro-generator). In one or more embodiments, a second fluid turbine 306 positioned along a supply line 294 is a wind turbine (such as a cold wind turbine) or a liquid turbine (such as a hydro-generator). The first fluid turbine 303 and the second fluid turbine 306 can both be used, or one of the first fluid turbine 303 or the second fluid turbine 306 can be omitted. The one or more return lines 296 and/or the one or more supply lines 294 can each include more than one fluid turbine 303, 306.

As shown in FIG. 3A, a recycling system 171 electrically connected to the one or more fluid turbines 303, 306 and the controller 144. In one or more embodiments, the recycling system 171 includes an input to an electrical grid and/or the electrical storage device 143 (such as a battery) mounted to the same platform as the processing chamber 110. The one or more fluid turbines 303, 306 are configured to harness energy from the supply and return lines 294, 296 and convert the harnessed energy into electrical energy, which can then be output into the recycling system 171. In one or more embodiments, the one or more fluid turbines harness energy in the form of heat energy and/or kinetic energy (e.g., from the flow of the cooling fluid). In one or more embodiments, the one or more fluid turbines harness energy in the form of potential energy (e.g., from the downward flow of the cooling fluid). In one or more embodiments, electrical energy produced by the one or more fluid turbines 303, 306 is sent to the electrical grid, is used by the controller 144, by the local process chamber 110, the fabrication facility, or is stored for later allocation to the processing system, the fabrication facility, and/or the electrical grid.

It is contemplated that multiple fluid turbines 303, 306 may be within the supply line 294, the return line 296, and/or the gas exhaust outlets 216. In one or more embodiments, the fluids flowing through the return line 296 and/or the gas exhaust outlets 216 may lead to a makeshift insulating layer which will increase the energy (e.g., the heat) of the fluid and, in turn, increase electrical energy produced by the one or more fluid turbines 303, 306.

Figure 3B:
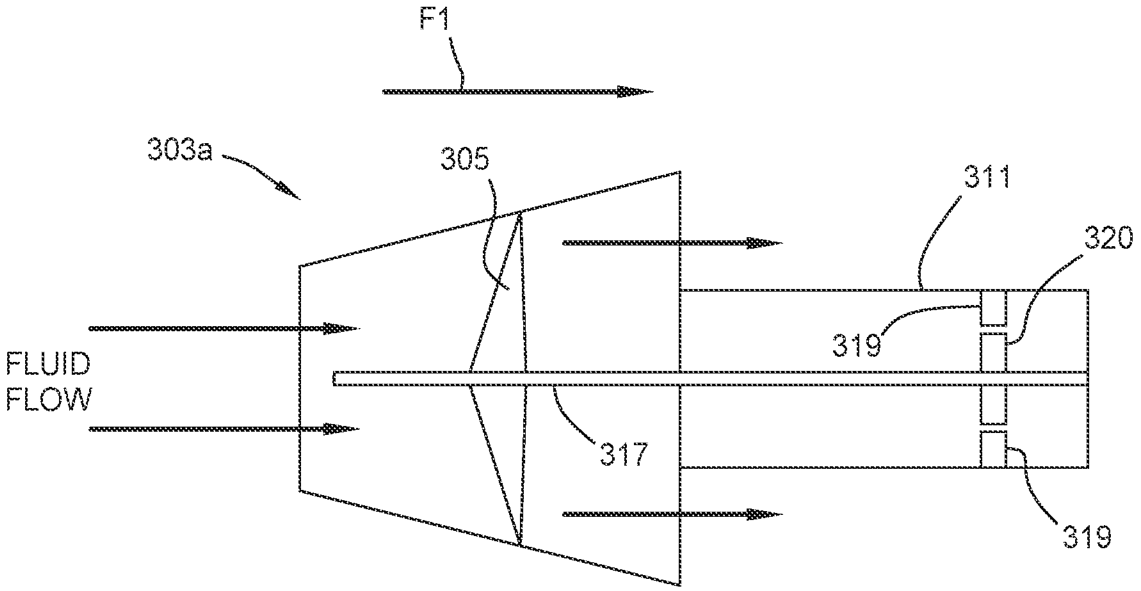
FIG. 3B is a partial schematic side cross-sectional view of a gas turbine, according to one or more embodiments.

FIG. 3B is a partial schematic side cross-sectional view of a gas turbine 303*a*, according to one or more embodiments. The gas turbine 303*a* can be used, for example, as the first fluid turbine 303 and/or the second fluid turbine 306 shown in FIG. 3A. The gas turbine 303*a* includes a plurality of blades 305, a horizontal shaft 317 coupled to the blades 305, a stator 319 (e.g., a ring, such as a bearing), and a rotor 320 (e.g., a disk). The stator 319 is in magnetic communication with the rotor 320. As shown in FIG. 3B, the rotor 320 is coupled to the horizontal shaft 317 and the stator 319 is positioned around the rotor 320. As shown in FIG. 3B, the horizontal shaft 317 is oriented substantially parallel to a flow direction F1 (e.g. less than 15 degrees relative to the flow direction F1) to harness the energy in the form of one or more of kinetic energy or heat energy from the fluid.

As heated gas expands through the gas turbine 303*a*, the gas rotates the blades 305, which spins the rotor 320 of an MGU 311 in order to harness and convert the heat energy and/or the kinetic energy into electrical energy. In one or more embodiments, the blades 305 are swept blades 341, as shown in FIG. 3E. In one or more embodiments, the MGU 311 of the gas turbine 303*a* is in electrical communication with the recycling system 171, such as an onboard battery and/or the input to the electrical grid.

It is contemplated that one or more MGUs 311 (such as two or more) can be part of the processing system for harnessing energy in relation to the process chamber 110. In one or more embodiments, electrical energy produced by the MGUs 311 may be utilized by the controller 144, by the local process chamber 110, the fabrication facility, or is stored for later allocation to the processing system, the fabrication facility, and/or the electrical grid.

In one or more embodiments, the shaft 317 and the blades 305 are disposed in a flow channel of the one or more cooling channels 271, 272, 273, 274, 275, 276. In one or more embodiments, the shaft 317 and the blades 305 are disposed in one or more of: a return channel of the one or more return lines 296, and/or a supply channel of the one or more supply lines 294.

Figure 3C:
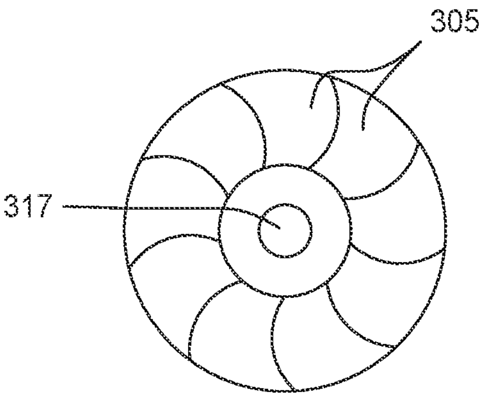
FIG. 3C is a partial schematic front view of the blades and the shaft shown in FIG. 3B, according to one or more embodiments.

FIG. 3C is a partial schematic front view of the blades 305 and the shaft 317 shown in FIG. 3B, according to one or more embodiments.

Figure 3D:
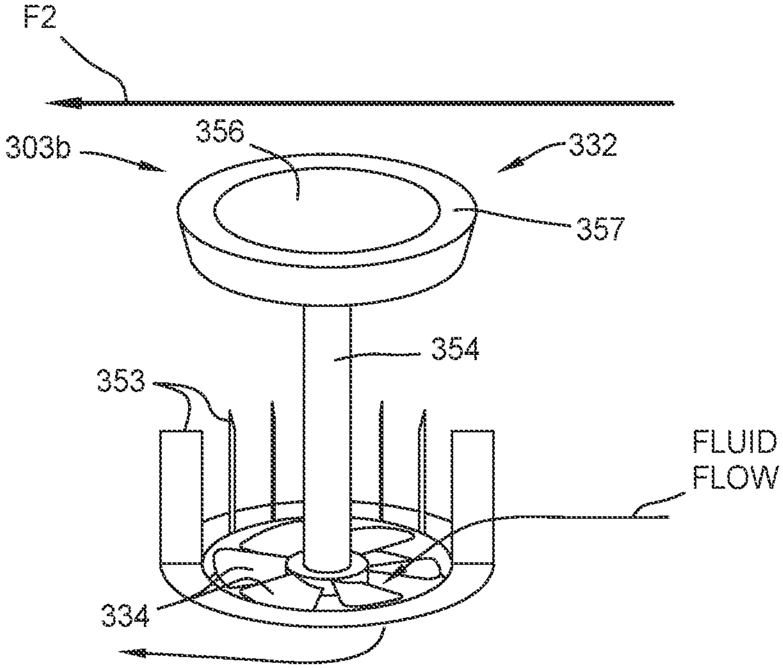
FIG. 3D is a partial schematic side cross-sectional view of a hydro-generator, according to one or more embodiments.
Figure 3E:
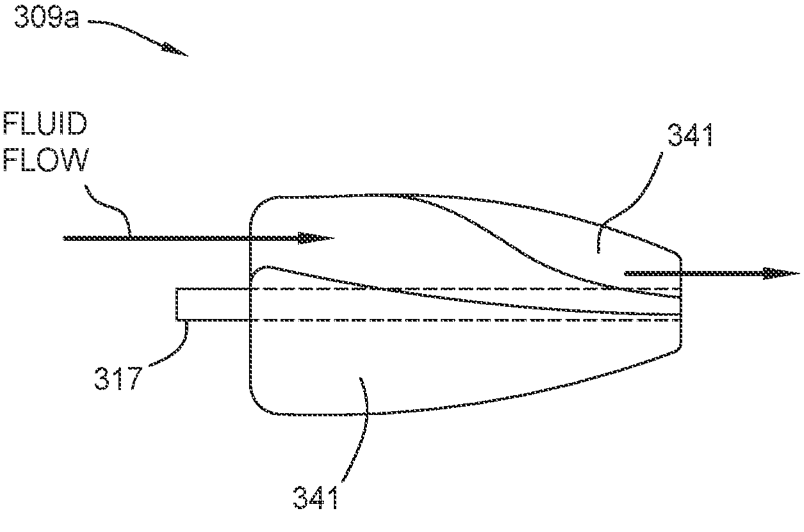
FIG. 3E is a partial schematic side cross-sectional view of a wind turbine, according to one or more embodiments.

FIG. 3D is a partial schematic side cross-sectional view of a liquid turbine 303*b*, according to one or more embodiments. The liquid turbine 303*b* (such as a hydro-generator) can be used, for example, as the first fluid turbine 303 and/or the second fluid turbine 306 shown in FIG. 3A.

The liquid turbine 303*b* includes blades 334, a vertical shaft 354, a rotor 356 (e.g., a disk), a stator 357 (e.g., a ring, such as a bearing), and a wicket gate 353. The rotor 356 and the stator 357 are part of an MGU 332. As shown in FIG. 3D, the rotor 356 is coupled to the vertical shaft 354 and the stator 357 is positioned around the rotor 356. As shown in FIG. 3D, the vertical shaft 354 is oriented substantially nonparallel to a flow direction F2 of the fluid (e.g. greater than 75 degrees from parallel) to harness the energy in the form of potential energy from the fluid. In one or more embodiments, the vertical shaft 354 is oriented substantially perpendicular to the flow direction F2.

As fluid, such a liquid, flows through the liquid turbine 303*b* with the help of gravity, the fluid rotates the blades 314, which spin the vertical shaft 354 and the rotor 356 to harness and convert potential energy and/or kinetic energy into electrical energy. In one or more embodiments, the liquid turbine 303*b* is in electrical communication with the recycling system 171.

It is contemplated that one or more liquid turbines 303*b* (such as two or more) are used in relation to the process chamber 110. In one or more embodiments, electrical energy produced by the one or more liquid turbines 303*b* may be utilized by the controller 144, by the local process chamber 110, the fabrication facility, or is stored for later allocation to the processing system, the fabrication facility, and/or the electrical grid. It is contemplated that one or more liquid turbines 303*b* may be disposed within the cooling channels 271, 272, 273, 274, 275, 276.

A liquid (such as water) can flow through the liquid turbine 303*b* at a flow rate within a range of 0 gallons per minute (GPM) to 50 GPM, such as within a range of 35 GPM to 36 GPM.

FIG. 3E is a partial schematic side cross-sectional view of a wind turbine 309*a*, according to one or more embodiments. The wind turbine 309*a* can be used, for example, as the first fluid turbine 303 and/or the second fluid turbine 306 shown in FIG. 3A. The wind turbine 309*a* includes swept blades 341.

Figure 4A:
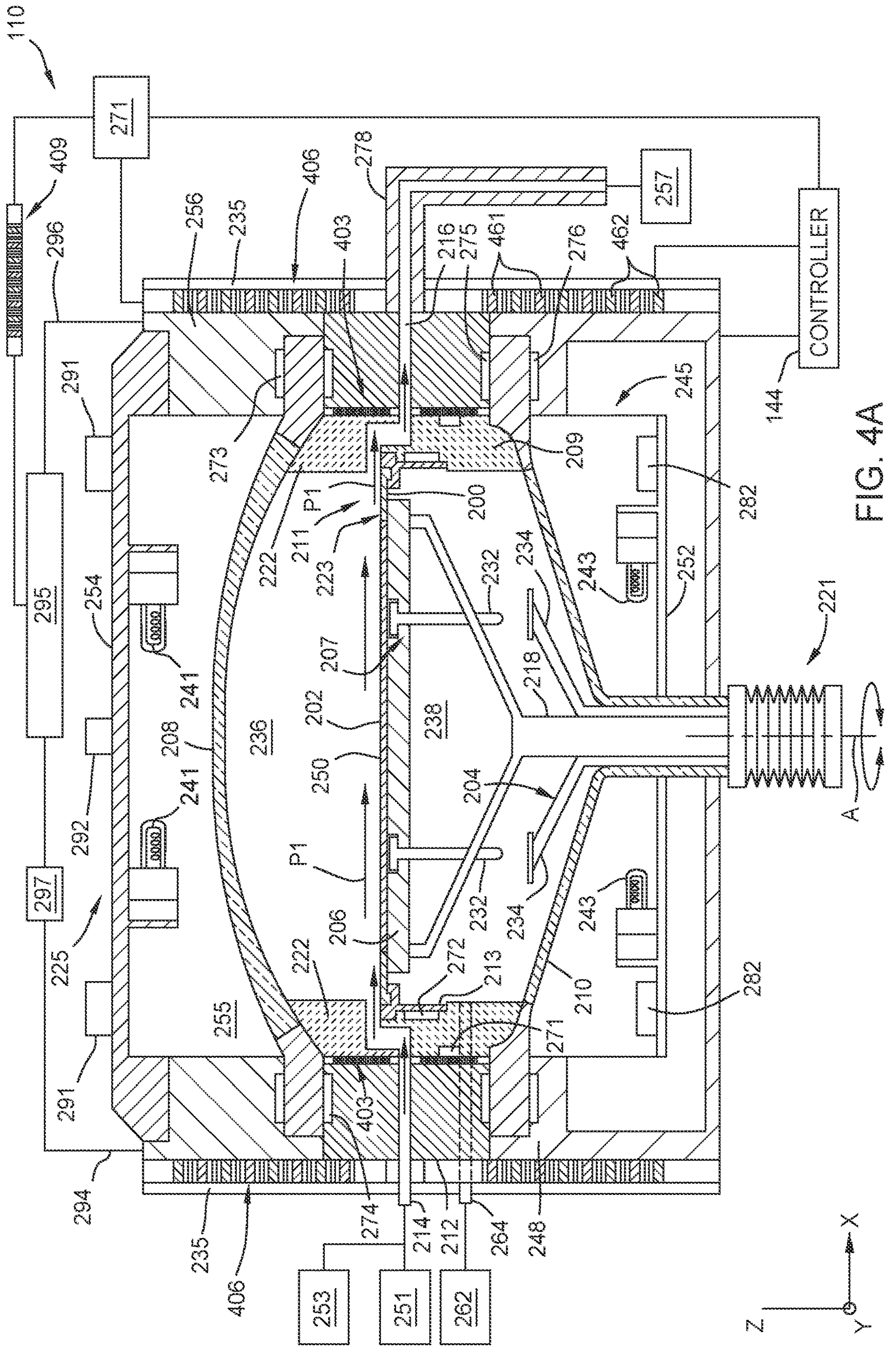
FIG. 4A is a partial schematic side cross-sectional view of a processing system including a processing chamber with one or more thermoelectric generators, according to one or more embodiments.

FIG. 4A is a partial schematic side cross-sectional view of a processing system including a processing chamber, such as the processing chamber 110 of FIG. 2, including one or more thermoelectric generators (TEGs) 403, 406, 409, according to one or more embodiments. The processing system shown in FIG. 4A is similar to the processing system shown in FIG. 2, and includes one or more features, aspects, components, operations, and/or properties thereof.

The one or more TEGs 403 are solid state semiconductor devices that are configured to convert a temperature difference (e.g., between two sides of the TEGs 403) into electrical energy through the transfer of electrons from the warmer side to the colder side. In one or more embodiments, a first array of TEGs 403 is disposed between the liners 209, 213, 222 and the one or more sidewalls (such as the flow module 212) of the chamber body. In one or more embodiments, a second array of TEGs 406 is disposed between the one or more sidewalls of the chamber body (such as the upper body 256, the flow module 212, and/or the lower body 248) and one or more metal plates 235 disposed outwardly of the one or more sidewalls (e.g., outwardly of the upper body 256, the flow module 212, and/or the lower body 248). The one or more metal plates 235 can be cooled by cooling channels and/or can be exposed to a surrounding environment (such as ambient air) such that the one or more metal plates 235 are at a lower temperature than the one or more sidewalls of the chamber body. In one or more embodiments, a third array of TEGs 409 is disposed between the heat exchanger unit 295 and the recycling system 171. Each array of TEGs is arranged such that one side of the array interfaces with cooler temperatures and the other side of the array interfaces with warmer temperatures. It is contemplated that one or more (such as two or more) arrays of TEGs can be used in relation to the process chamber 110. In one or more embodiments, one or more TEGs interface with one or more components that have the one or more of cooling channels 271, 272, 273, 274, 275, 276. One or more TEGs can be disposed at any location of the processing system where there is a dichotomy of temperature such that one side of the one or more TEGs interfaces with cooler temperatures and the other side of the one or more TEGs interfaces with warmer temperatures. In one or more embodiments, the one or more TEGs 403, 406, 409 are utilized in conjunction with the cooling channels 271, 272, 273, 274, 275, 276. The one or more cooling channels can facilitate the temperature difference across the TEGs.

The present disclosure contemplates that part of the TEGS 403, 406, 409 may be used. For example, one or more of the arrays 403, 406, 409 can be omitted.

The recycling system 171 is in electrical communication with the one or more TEGs 403, 406, 409 and the controller 144. In one or more embodiments, electrical energy produced by the one or more TEGs 403 may be utilized by the controller 144, by the local process chamber 110, the fabrication facility, or is stored for later allocation to the processing system, the fabrication facility, and/or the electrical grid.

Figure 4B:
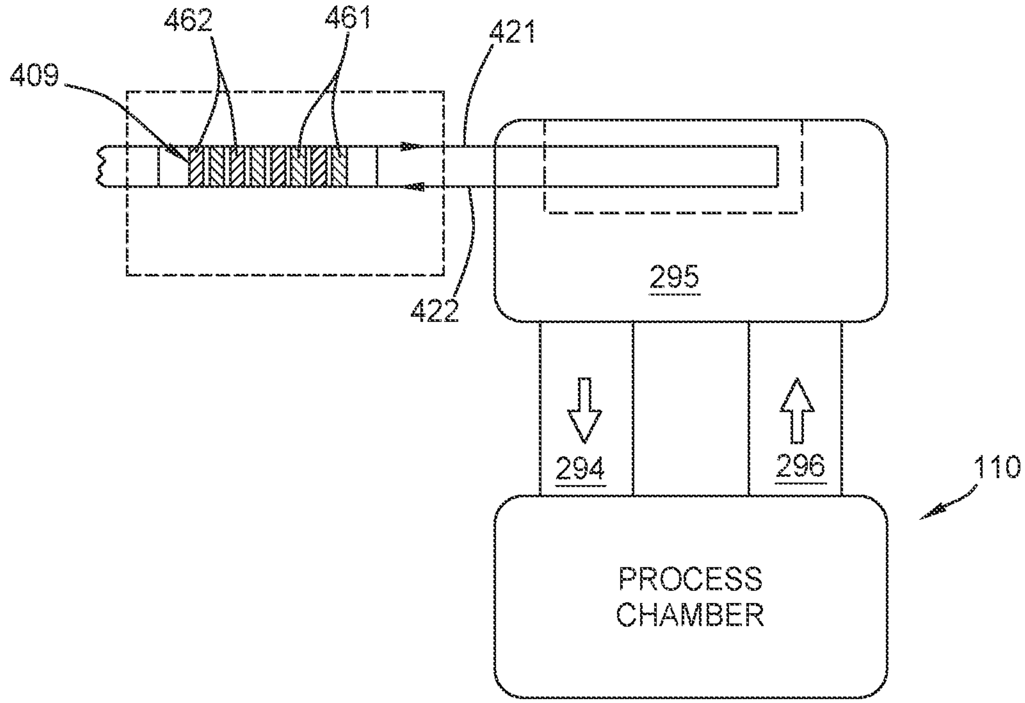
FIG. 4B is a partial schematic plan view of the processing system shown in FIG. 4A, according to one or more embodiments.

FIG. 4B is a partial schematic plan view of the processing system shown in FIG. 4A, according to one or more embodiments.

As shown in FIG. 4B, the third array of TEGs 409 are disposed between a first fluid section 421 (e.g., a supply section, such as a cool section) of a heat exchanger fluid and a second fluid section 422 (e.g., a return section 422, such as a hot section) of the heat exchanger fluid. The first fluid section 421 has a first temperature, the second fluid section 422 has a second temperature, and the second temperature is higher than the first temperature.

The heat exchanger fluid receives heat from the cooling fluid that flows from the one or more return lines 296, through the heat exchanger unit 295, and to the one or more supply lines 294. The third array of TEGs 409 can be disposed outside of the heat exchanger unit 205, or can be disposed within the heat exchanger unit 295. The present disclosure contemplates that one or more liquid turbines 306*a* can be disposed along the supply section 421 and/or the return section 422. In one or more embodiments the cooling fluid in the lines 294, 296 includes air, and the heat exchanger fluid in the sections 421, 422 includes water.

Figure 4C:
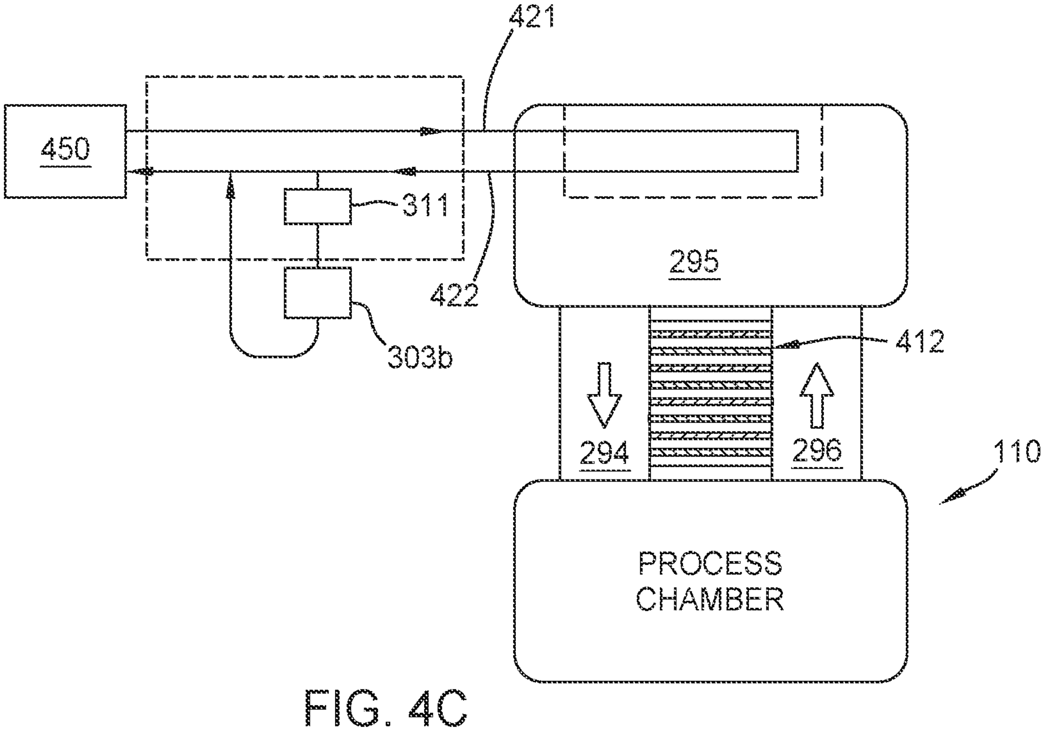
FIG. 4C is a partial schematic side cross-sectional view of a processing chamber with a thermoelectric generator, according to one or more embodiments.

FIG. 4C is a partial schematic plan view of a processing system, according to one or more embodiments. In the processing system shown in FIG. 4C, an array of TEGs 412 is disposed between the one or more supply lines 294 and the one or more return lines 296. The TEGs 403, 406, 409, 412 can be used instead or, and/or in addition to, the cooling channels 271, 272, 273, 274, 275, and/or 276. The TEGs 403, 406, 409, 412 are respectively at least part of an energy harnessing device.

As shown in FIGS. 4A-4C, each array of TEGs 403, 406, 409, 412 includes a first thermoelectric material 461 and a second thermoelectric material 462 that is different than the first thermoelectric material 461. A first array of the first thermoelectric material 461 is disposed in an alternating arrangement with a second array of the second thermoelectric material 462. In one or more embodiments, the first thermoelectric material and the second thermoelectric material each includes one or more of: copper (Cu), iron (Fe), bismuth ($Bi_2Te_3$), telluride (Te), lead telluride (PbTe), and/or silicon germanium (SiGe). In one or more embodiments, the first thermoelectric material 461 includes copper (Cu) and the second thermoelectric material 462 includes iron (Fe). In one or more embodiments, the first thermoelectric material 461 is a p-type material and the second thermoelectric material 462 includes an n-type material. The first and second thermoelectric materials 461, 462 are disposed electrically in series and thermally in parallel. The present disclosure contemplates that other elements can be used for the first thermoelectric material and/or the second thermoelectric material.

In one or more embodiments, one or more TEGs are disposed to interface with other parts of the processing system 100. For example, one or more TEGs can interface with the subfab support equipment 123. In one or more embodiments, the one or more TEGs interface with pump(s), heat exchanger(s), the abatement, and/or scrubber(s) of the subfab support equipment 123. The abatement can combust a fuel to burn gases in exhausted gas that is exhausted through the exhaust system 278 and flowed through semi cap equipment. The one or more TEGs can interface with the semi cap equipment of the abatement to harness energy (e.g., heat energy) of the exhausted gas that is burned using the combusted fuel.

In one or more embodiments, at least one liquid turbine 303*b* is disposed along the first fluid section 421 and/or the second fluid section 422. At least one liquid turbine 303*b* can be disposed at least along the fluid section 422 having a higher temperature to facilitate reduced effects of choking flow. In one or more embodiments fluid is diverted (e.g., using a T-connection) from the fluid section 422 to a reservoir 311 prior to flowing through the liquid turbine 303*b*, to facilitate reduced effects of choking flow. The present disclosure contemplates that the one or more liquid turbines 303*b* can be used with or without the array of TEGs 412.

In one or more embodiments, the harnessed energy is recovered and re-used without converting the harnessed energy (e.g. thermal energy) into electrical energy. The fluid in the second fluid section 422 flows to interface with a system portion 450. As an example, the harnessed energy received by the heat exchanger fluid in the second fluid section 422 can be re-used in the processing system 100 without the use of the one or more TEGs 412 and/or the one or more liquid turbines 303*b*. The harnessed energy in the second fluid section 422 can be transferred to a gas panel (such as the process gas source(s) 251, the cleaning gas source(s) 253, the purge gas source(s) 262, and/or fluid lines connected thereto) of the system portion 450 to facilitate reducing or preventing condensation of gas(es). The fluid in the second fluid section 422 can flow, for example, through one or more heater jackets. The harnessed energy in the second fluid section 422 can be transferred to a foreline of the processing chamber 110 and/or the exhaust system 278 to facilitate reduced or prevented parasitic deposition and/or clogging.

Figure 5:
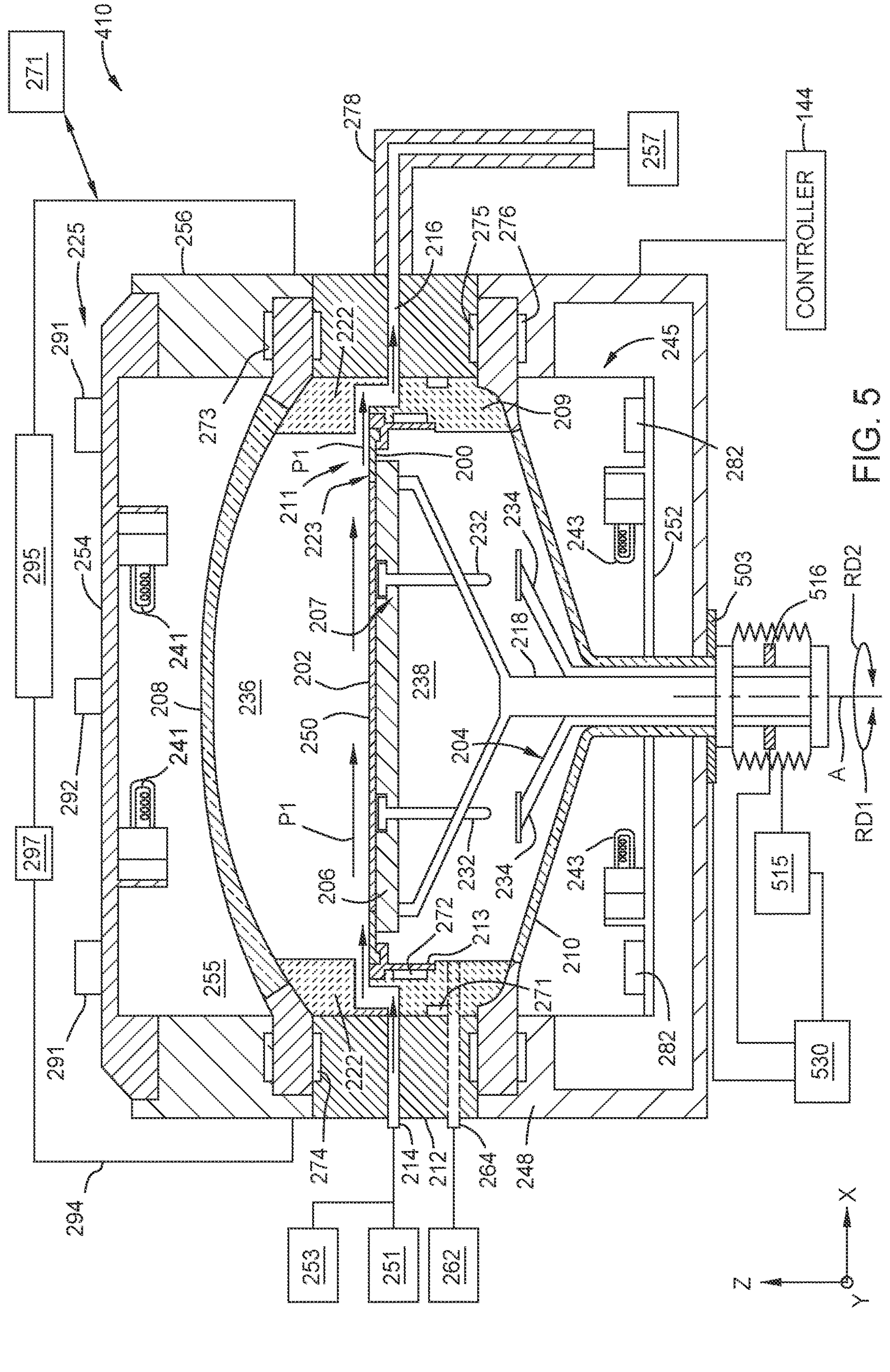
FIG. 5 is a partial schematic side cross-sectional view of a processing system including a processing chamber, such as the processing chamber of FIG. 2, including a kinetic energy MGU, according to one or more embodiments.

FIG. 5 is a partial schematic side cross-sectional view of a processing system including a processing chamber, such as the processing chamber 110 of FIG. 2, including a kinetic energy MGU, according to one or more embodiments. In one or more embodiments, a lift motor 515 is configured to raise and lower the support shaft 218, and a rotation motor is configured to rotate the support shaft 218. The rotation motor includes a first stator 516 in magnetic communication with a first part (such as an end) of the support shaft 218 (such as through a rotation shaft of the rotation motor), and a energy harnessing device includes a second stator 503 in magnetic communication with a second part of the support shaft 218. The second stator 503 is configured to harness kinetic energy as the shaft 518 rotates and convert the kinetic energy into electrical energy. In one or more embodiments, electrical energy produced by the second stator 503 may be utilized by the controller 144, by the local process chamber 110, the fabrication facility, or is stored for later allocation to the processing system, the fabrication facility, and/or the electrical grid. In one or more embodiments, the electrical energy produced by the second stator 503 is utilized to power the rotation and actuation of the support shaft 218 (using the first stator 516 and/or the lift motor 515), such that the rotation and/or actuation of the shaft 218 is at least partially self-sustaining (such as completely self-sustaining). The second stator 503 is part of the kinetic energy MGU. The energy harnessing device can facilitate enhanced leveling of the substrate support 206, such as during rotation. During processing (such as deposition and/or cleaning), the shaft 218 can rotate the substrate support 206 at a speed of about 60 rotations-per-minute, for example.

The second stator 503 utilizes magnetic fields to restrict the rotation of the support shaft 218 to slow the rotation of the support shaft 218 and generate electrical energy from the harnessed kinetic energy. In one or more embodiments, electrical energy produced by the second stator 503 may be utilized by the controller 144, by the local process chamber 110, the fabrication facility, or is stored for later allocation to the processing system, the fabrication facility, and/or the electrical grid. In one or more embodiments, the electrical energy produced by the second stator 503 is stored in a drive battery 530 configured to supply electrical power to the lift motor 515 and/or the first stator 516 of the rotation motor. In one or more embodiments, the second stator 503 is disposed about an end portion of the support shaft 218, and the rotation motor 516 includes the rotation shaft coupled to the support shaft 218, with the first stator 516 disposed about the rotation shaft.

In one or more embodiments, the rotation motor and the energy harnessing device are at least partially integrated as a bi-directional stator. For example, the first stator 516 and the second stator 503 can be integrated as a single bi-directional stator. Using the bi-directional stator, rotation of the support shaft 218 in a first rotational direction RD1 harnesses the energy to brake (e.g., slow and/or stop) rotation of the support shaft 218, and the bi-directional stator is configured to rotate the support shaft 218 in a second rotational direction RD2 that is opposite of the first rotational direction RD1.

Figure 6:
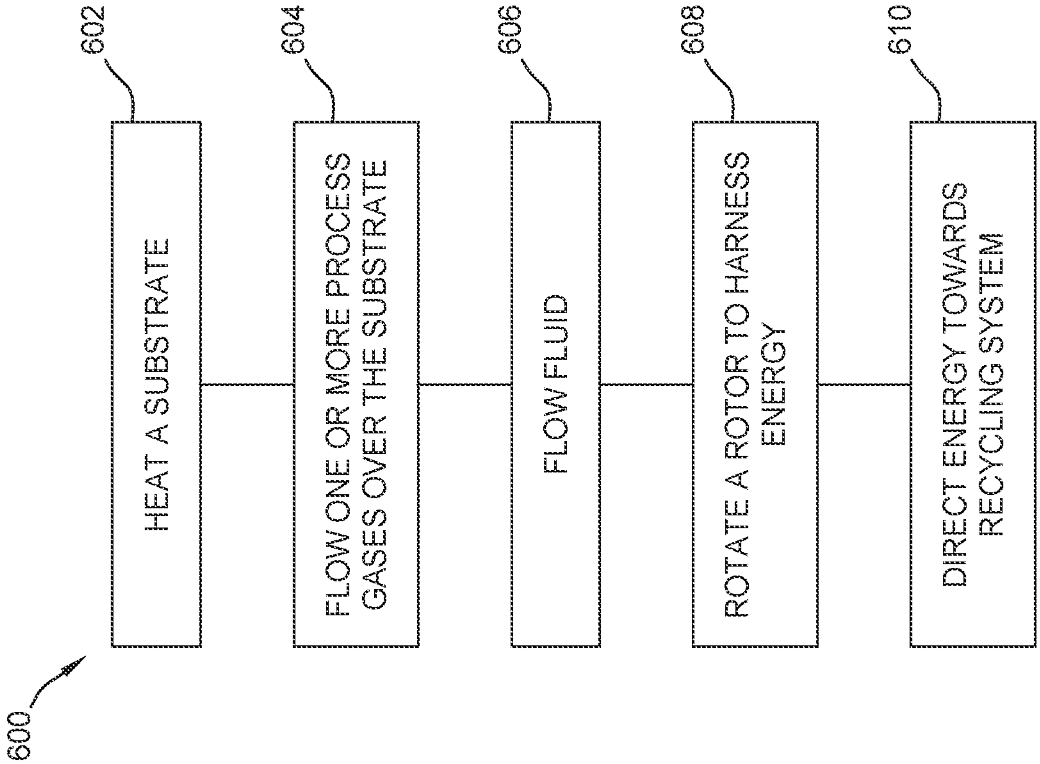
FIG. 6 is a schematic block diagram view of a method of processing substrates, according to one or more embodiments.

FIG. 6 is a schematic block diagram view of a method 600 of processing substrates, according to one or more embodiments.

Operation 602 includes heating a substrate, such as the substrate 202 as shown in FIG. 2, positioned on a substrate support, such as substrate support 206 as shown in FIG. 2.

Operation 604 includes flowing one or more process gases toward an internal volume of a process chamber, such as the process chamber 110 as shown in FIG. 2 (e.g. through the one or more gas inlets 214).

Operation 606 includes flowing a fluid through at least part of the chamber to cool at least the part of the chamber (e.g. through cooling channels 271, 272, 273, 274, 275, 276 of process chamber 110).

Operation 608 includes harnessing energy, the harnessing of energy including spinning turbines, such as the one or more fluid turbines 303, 306 as shown in FIG. 3A and/or the support shaft 218 as shown in FIG. 5. The harnessing can occur, for example, during heating of the process chamber, such as process chamber 110 as shown in FIG. 2

Operation 610 includes directing the harnessed energy towards a recycling system. In one or more embodiments, the recycling system includes the electrical storage device 143, such as a battery. In one or more embodiments, the recycling system includes the input to the electrical grid.

Figure 7:
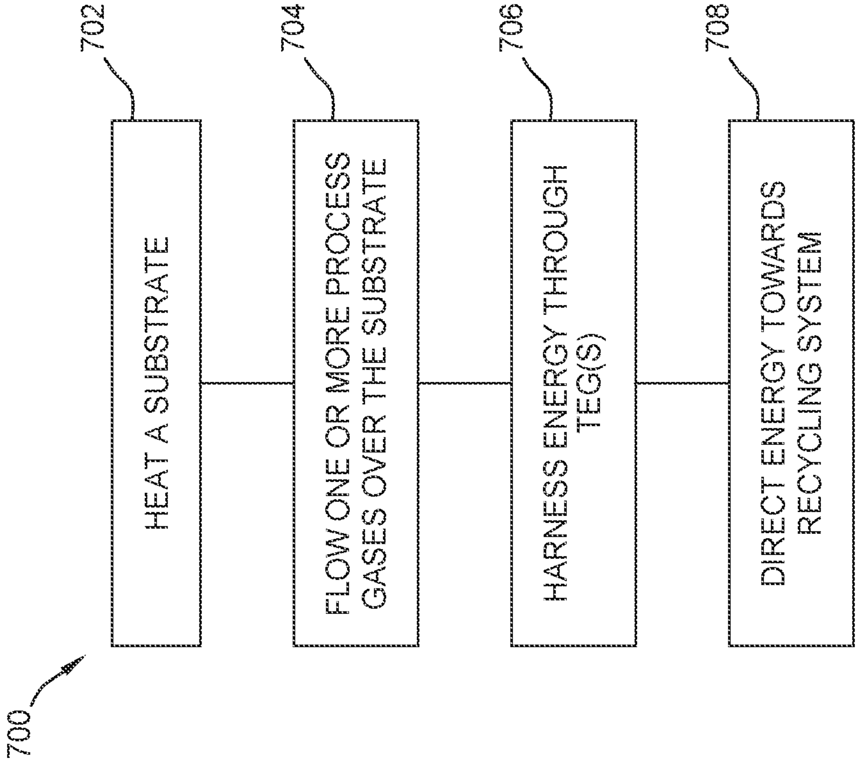
FIG. 7 is a schematic block diagram view of a method of processing substrates, according to one or more embodiments.

FIG. 7 is a schematic block diagram view of a method 700 of processing substrates, according to one or more embodiments.

Operation 702, includes heating a substrate, such as the substrate 202 as shown in FIG. 2, positioned on a substrate support, such as substrate support 206 as shown in FIG. 2.

Operation 704 includes flowing one or more process gases toward an internal volume of a process chamber, such as the process chamber 110 as shown in FIG. 2 (e.g. through the one or more gas inlets 214).

Operation 706 includes harnessing energy through one or more TEGs, as shown for example in FIGS. 4A-4C. The harnessing of energy can be conducted, for example, during heating of the process chamber, such as the process chamber 110 as shown in FIG. 2.

Operation 708 includes directing the harnessed energy towards the recycling system.

Substrates and other chamber components can experience temperatures up to and exceeding 1100 degrees Celsius, such as between 300-500 degrees Celsius and/or between 450-700 degrees Celsius. Such temperatures may lead to a loss in material integrity of certain chamber components, thus cooling modules (e.g. a variable speed blower and/or cooling channels) are employed within the process chamber in order to reduce temperatures of components. Efforts to address such heat issues with cooling modules leads to inefficient energy utilization, with up to and exceeding 70% waste in energy that is generally lost in the form of heat dissipation.

Benefits of the present disclosure include more efficient utilization of energy, such as recovery of energy otherwise lost in the form of heat (e.g. up to a 70% (or higher) reduction in loss of energy, up to a 30% (or higher) increase in energy efficiency, and/or up to a 30% (or higher) increase in redirection of energy that would otherwise be lost), the captivation and utilization of energy not formerly recovered, and the ability to self-sustain certain aspects of a substrate processing chamber. For example, heat energy may be redirected from chamber walls to maintain fluid lines (e.g., exhaust pipes and/or foreline pipes) above a threshold temperature to reduce or eliminate deposition in the fluid lines. As another example, the present disclosure increases the energy efficiencies of processing systems, chambers, and methods using harnessing of energy that may be otherwise lost as heat or fluid flow effects. The harnessed energy is converted into electrical energy, which can be recycled and reused to power components of the process chamber, the system, or the fabrication facility. The harnessed energy can be transmitted to an electrical grid, or stored for later use. Benefits include reduced power consumption, reduced cost expenditures, reduced material degradation due to heat, and increased component lifespans.

It is contemplated that one or more portions of the subject matter disclosed herein may be combined. As an example, one or more aspects, features, components, operations, and/or properties of the various implementations of the processing system 100, the controller 144, the electrical storage device 143, the recycling system 171, the processing chamber 110, the fluid turbine 303, 306 implementations shown in FIGS. 3A-3E, the TEG 403, 406, 409, 412 implementations shown in FIGS. 4A-4C, the first and second stator 503, 516 implementations shown in FIG. 5, the method 600, and/or the method 700 may be combined. As an example, a processing system can use one or more of the TEGs 403, 406, 409, 412, one or more of the fluid turbines 303, 306 (in relation to the one or more cooling channels), and/or the stator 503 in relation to one processing chamber 110. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A processing system applicable for use in semiconductor manufacturing, comprising:
- a chamber comprising:
  - one or more sidewalls at least partially defining an internal volume,
  - one or more windows at least partially defining a processing volume of the internal volume,
  - one or more heat sources configured to generate heat,
  - a liner disposed in the internal volume and lining at least part of one or more sidewalls, and
  - one or more cooling channels;
- a fluid system in fluid communication with the one or more cooling channels, the fluid system comprising:
  - one or more supply lines configured to supply a fluid to the one or more cooling channels at a first temperature,
  - one or more return lines configured to flow the fluid from the one or more cooling channels at a second temperature that is higher than the first temperature,
  - a heat exchanger unit disposed between the one or more supply lines and the one or more return lines to receive heat from the fluid, and
  - a fluid motor disposed between the one or more supply lines and the one or more return lines, the fluid motor configured to move the fluid;
- an energy harnessing device configured to harness energy to produce electrical energy, the energy harnessing device comprising:
  - one or more turbines disposed along the one or more return lines and configured to harness kinetic energy from the fluid.

2. The processing system of claim 1, wherein the one or more turbines comprise one or more motor generator units, the one or more motor generator units comprising:
- a shaft;
- a plurality of blades coupled to the shaft;
- a rotor coupled to the shaft; and
- a stator in magnetic communication with the rotor.

3. The processing system of claim 2, further comprising a battery, and wherein the one or more motor generator units are in electrical communication with the battery to store the electrical energy in the battery.

4. The processing system of claim 2, wherein the one or more motor generator units are in electrical communication with an input of an electrical grid to transmit the electrical energy to the input.

5. The processing system of claim 2, wherein the fluid motor comprises one or more of a variable speed blower, a fan, a compressor, or a pump.

6. The processing system of claim 2, wherein the shaft is oriented substantially parallel to a flow direction of the fluid.

7. The processing system of claim 2, wherein the energy harnessing device further comprises one or more second turbines disposed along the one or more supply lines and configured to harness potential energy from the fluid, and a shaft of the one or more second turbines is oriented substantially nonparallel to a flow direction of the fluid.

8. The processing system of claim 2, wherein the shaft and the blades are disposed in a return channel of the one or more return lines.

9. The processing system of claim 2, wherein the shaft and the blades are disposed in a flow channel of the one or more cooling channels.

10. The processing system of claim 1, wherein the one or more cooling channels are formed at least partially in or interface at least partially with the liner.

11. The processing system of claim 1, wherein the one or more cooling channels are formed at least partially in or interface at least partially with the one or more sidewalls.

12. The processing system of claim 11, wherein the one or more cooling channels are aligned at least partially with the one or more windows.

13. A processing system applicable for use in semiconductor manufacturing, comprising:

a chamber comprising:

one or more sidewalls at least partially defining an internal volume, one or more windows at least partially defining a processing volume of the internal volume, one or more heat sources configured to generate heat, a liner disposed in the internal volume and lining at least part of one or more sidewalls, a substrate support disposed in the internal volume, a support shaft coupled to the substrate support;

a drive system, comprising:

a rotation motor configured to rotate the support shaft, a lift motor configured to raise and lower the support shaft, a drive battery configured to supply electrical power to the rotation motor and the lift motor; and an energy harnessing device configured to harness energy from the support shaft to produce electrical energy, the harnessed energy including kinetic energy of the support shaft when the support shaft is rotating.

14. The processing system of claim 13, wherein the rotation motor comprises a first stator in magnetic communication with a first part of the support shaft, and the energy harnessing device comprises a second stator in magnetic communication with a second part of the support shaft.

15. The processing system of claim 13, wherein the rotation motor and the energy harnessing device are at least partially integrated as a bi-directional stator, wherein rotation of the support shaft in a first rotational direction harnesses the energy to brake rotation of the support shaft, and the bi-directional stator is configured to rotate the support shaft in a second rotational direction that is opposite of the first rotational direction.

16. The processing system of claim 13, wherein the energy harnessing device is in electrical communication with the drive battery to store the electrical energy in the drive battery.

17. A processing system applicable for use in semiconductor manufacturing, comprising:

a chamber comprising:

one or more sidewalls at least partially defining an internal volume, one or more windows at least partially defining a processing volume of the internal volume, one or more heat sources configured to generate heat, a liner disposed in the internal volume and lining at least part of one or more sidewalls, a substrate support disposed in the internal volume, a support shaft coupled to the substrate support;

a drive system, comprising:

a rotation motor configured to rotate the support shaft, the rotation motor comprising a first stator in magnetic communication with a first part of the support shaft, a lift motor configured to raise and lower the support shaft, a drive battery configured to supply electrical power to the rotation motor and the lift motor; and an energy harnessing device configured to harness energy from the support shaft to produce electrical energy, the energy harnessing device comprising a second stator in magnetic communication with a second part of the support shaft.

18. The processing system of claim 17, wherein:

the rotation motor and the energy harnessing device are at least partially integrated as a bi-directional stator;

rotation of the support shaft in a first rotational direction harnesses the energy to brake rotation of the support shaft; and the bi-directional stator is configured to rotate the support shaft in a second rotational direction that is opposite of the first rotational direction.

* * * * *